United States Patent [19]
Honda et al.

[11] Patent Number: 5,324,977
[45] Date of Patent: Jun. 28, 1994

[54] HYBRID FERROMAGNETIC INTEGRATED CIRCUIT DEVICE

[75] Inventors: Ziro Honda, Itami; Masato Imanaka, Kawanishi, both of Japan

[73] Assignee: Mitsubishi Denki Kabushiki Kaisha, Tokyo, Japan

[21] Appl. No.: 978,424

[22] Filed: Nov. 18, 1992

[30] Foreign Application Priority Data

Jul. 30, 1992 [JP] Japan .................. 4-203727

[51] Int. Cl.$^5$ ............................................. H01L 27/22
[52] U.S. Cl. .................................... 257/421; 257/422; 257/427; 257/778; 257/425
[58] Field of Search ............... 257/421, 422, 423, 424, 257/425, 426, 427, 778

[56] References Cited

U.S. PATENT DOCUMENTS

| | | | |
|---|---|---|---|
| 4,398,342 | 8/1983 | Pitt et al. | 257/425 X |
| 4,823,177 | 4/1989 | Prinz et al. | 257/421 |
| 4,945,397 | 7/1990 | Schuetz | 257/421 |
| 5,005,064 | 4/1991 | Yoshino et al. | 257/427 X |
| 5,196,821 | 3/1993 | Partin et al. | 257/421 X |

*Primary Examiner*—William Mintel
*Attorney, Agent, or Firm*—Leydig, Voit & Mayer

[57] ABSTRACT

A hybrid integrated circuit device has a magnetic sensor formed directly on a substrate by photolithography. Alternatively, a flip chip type magnetic sensor is mounted on a substrate by fusion. The magnetic sensor can be mounted on the substrate with high positional precision.

3 Claims, 5 Drawing Sheets

1

HYBRID FERROMAGNETIC INTEGRATED CIRCUIT DEVICE

BACKGROUND OF THE INVENTION

1. Field of the Invention

The present invention relates to a hybrid integrated circuit device, and particularly to a hybrid integrated circuit device using a magnetic sensor, for example, a magnetic resistor element.

2. Description of the Related Art

FIG. 7 is a schematic block diagram showing a conventional hybrid integrated circuit device, and FIG. 8 is a side view of the same device. In FIG. 8, IC (integrated circuit) is not shown. In the drawings, a magnetic sensor, e.g., a resin-molded magnetic resistor element 2, is mounted on a substrate, e.g., a thick substrate 1, with solder 3. An IC 4 serving as a control circuit for the magnetic resistor element 2 is also provided on the thick substrate 1, the magnetic resistor element 2 and the IC 4 being electrically connected to each other by wiring conductors 5.

The conventional hybrid integrated circuit device is configured as described above, and a non-contact type potentiometer or the like uses the magnetic resistor element 2 which changes its resistance value in accordance with the amount of magnetic flux intersecting it from outside. Such a non-contact type potentiometer has a movable section having an extremely small sliding resistance and is thus widely employed in the detection section of precision equipment for detecting and measuring small displacements.

In the above hybrid integrated circuit device, since the magnetic resistor element 2 is mounted on the thick substrate 1 by soldering, the magnetic resistor element 2 cannot be positioned with respect to the thick substrate 1 with high precision, so that a small displacement cannot be precisely detected and measured. Namely, since deviations occur in the direction and angle of the magnetic field generated in the magnetic resistor element 2, which are due to positional deviations caused by soldering of the magnetic resistor element 2 and the thick substrate 1 through leads, the conventional device has the problem that a small displacement cannot be precisely detected.

SUMMARY OF THE INVENTION

The present invention has been achieved for solving the above problem, and an object of the present invention is to provide a hybrid integrated circuit device in which the positional precision of a magnetic resistor element is increased so that a small displacement can be precisely detected.

In accordance with one aspect of the present invention, there is provided a hybrid integrated circuit device comprising a substrate, a magnetic sensor formed on the substrate by photolithography, a control circuit provided on the substrate for controlling the magnetic sensor, and wiring conductors electrically connecting the magnetic sensor and the control circuit.

In accordance with another aspect of the present invention, there is provided a hybrid integrated circuit device comprising a substrate, a flip chip type magnetic sensor mounted on the substrate by a fusion technique using bumps, a control circuit provided on the substrate for controlling the magnetic sensor, and wiring conductors electrically connecting the magnetic sensor and the control circuit.

DESCRIPTION OF PREFERRED EMBODIMENTS

Figure 1:
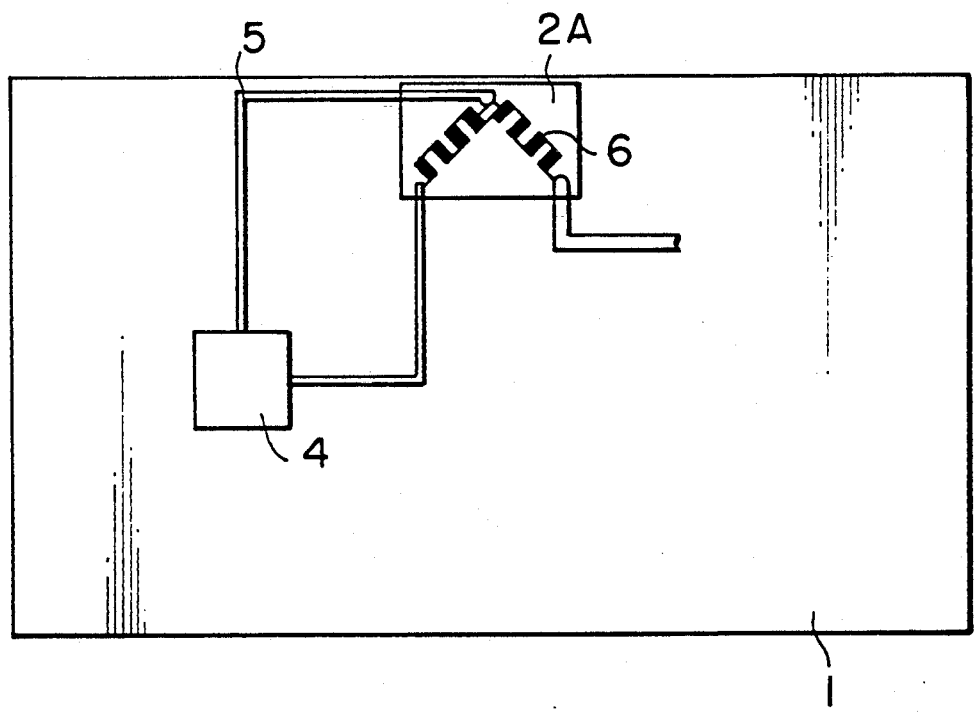
FIG. 1 is a schematic block diagram showing a hybrid integrated circuit device in accordance with an embodiment of the present invention.

FIG. 1 is a schematic block diagram showing a hybrid integrated circuit device in accordance with an embodiment of the present invention. In the drawings, the same reference numerals denote the same or equivalent portions. In FIG. 1, a magnetic resistor element 2A is formed as a magnetic sensor directly on a thick substrate 1 such as a ceramic substrate or the like by photolithography. An IC 4 serving as a control circuit for the magnetic resistor element 2A is also disposed on the thick substrate 1. The magnetic resistor element 2A and the IC 4 are electrically connected by wiring conductors 5.

Figure 2:
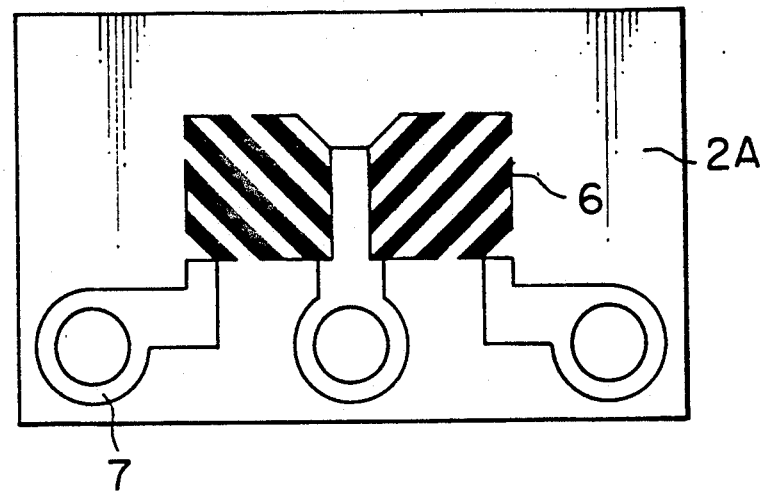
FIG. 2 is a plan view showing the magnetic resistor element shown in FIG. 1.
Figure 3:
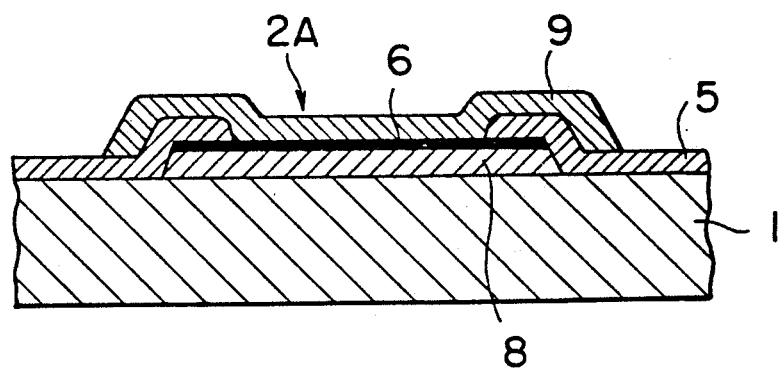
FIG. 3 is a schematic sectional view showing a magnetic resistor element.

FIG. 2 is a plan view showing the magnetic resistor element 2A. A ferromagnetic substance 6 which forms a magnetic resistor element circuit is provided on the magnetic resistor element 2A, terminals 7 being connected to the ferromagnetic substance 6. A material such as Ni-Co, In-Al or the like is used as the ferromagnetic substance 6. FIG. 3 is a schematic sectional view of the magnetic resistor element 2A. The magnetic resistor element 2A is disposed on the glass 8 on the thick substrate 1, and protective glass 9 is disposed on the surface of the magnetic resistor element 2A to protect the surface.

In the hybrid integrated circuit device configured as described above, the magnetic resistor element 2A can be formed directly on the thick substrate 1 with high positional precision by photolithography. Namely, since the magnetic resistor element 2A can be patterned directly on the thick substrate 1, positional precision can be significantly increased. When the hybrid integrated circuit device is used as a non-contact type potentiometer for detecting and measuring small displacements, small displacements can thus be detected m and measured.

Figure 4:
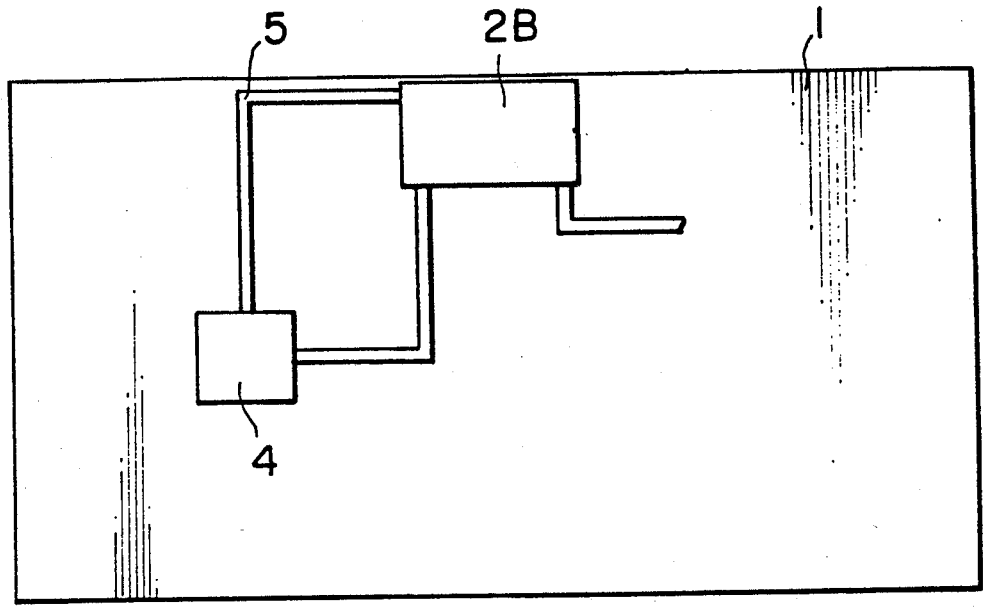
FIG. 4 is a schematic block diagram showing a hybrid integrated circuit device in accordance with another embodiment of the present invention.
Figure 5:
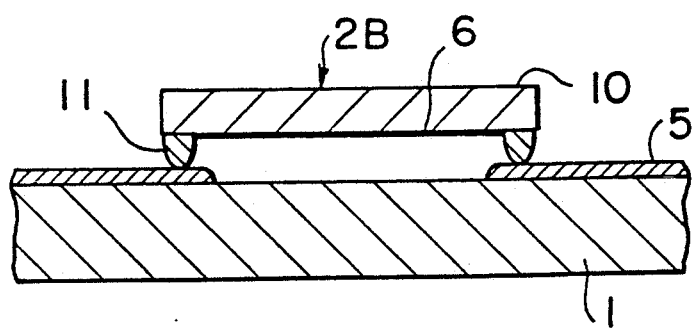
FIG. 5 is a schematic sectional view showing the magnetic resistor element shown in FIG. 4.

Although the above embodiment concerns the magnetic resistor element 2A formed directly on the thick substrate 1 by photolithography, a magnetic resistor element 2B may be formed as a flip chip and mounted on a thick substrate 1 by a fusion technique using a plurality of bumps 11, as shown in FIGS. 4 and 5. This device exhibits the same effects as those described above. In this case, a ferromagnetic substance 6 is located on a glass substrate 10, the ferromagnetic substance 6 and wiring conductors 5 being electrically connected by the bumps 11. In addition, since the plurality of bumps 11 can be simultaneously fused, precise positioning can be achieved without deviation.

Figure 6:
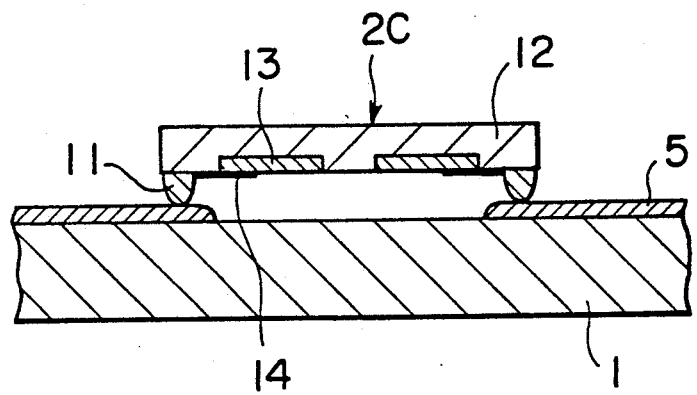
FIG. 6 is a schematic sectional view showing a magnetic resistor element in accordance with a further embodiment of the present invention.
Figure 7:
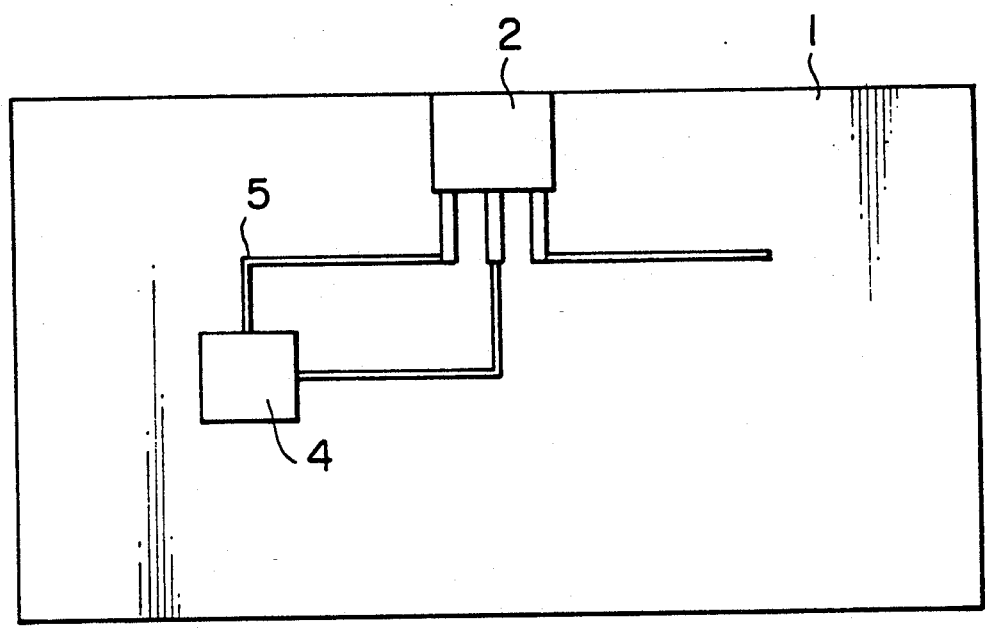
FIG. 7 is a schematic block diagram showing a conventional hybrid integrated circuit device.
Figure 8:
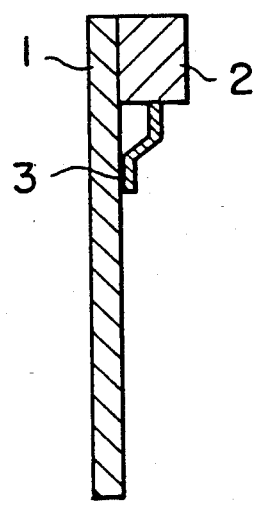
FIG. 8 is a side view of a principal portion of the hybrid integrated circuit device shown in FIG. 7.

A hybrid integrated circuit device may comprise a magnetic resistor element 2C having a semiconductor substrate 12 and a diffused region 13 the semiconductor resister element 12 as a ferromagnetic substrate, as shown in FIG. 6. The diffusion region 13 and bumps 11 are electrically connected by, for example, aluminum wires 14.

A Hall element can also be used in place of the magnetic resistor element 2A, 2B or 2C.

What is claimed is:

1. A hybrid integrated magnetic resistor circuit device comprising:
   a ceramic substrate;
   a magnetic resistor element disposed directly on said ceramic substrate, said magnetic resistor element including a base glass layer directly contacting said ceramic substrate and a ferromagnetic film and a protective glass layer successively disposed on said base glass layer;
   a control circuit disposed on said ceramic substrate for controlling said magnetic resistor element; and
   wire conductors disposed on said ceramic substrate electrically connecting said magnetic resistor element to said control circuit.

2. A hybrid integrated magnetic resistor device comprising:
   a ceramic substrate;
   a semiconductor substrate including a diffused region as a magnetic resistor element, bump electrodes disposed on said semiconductor substrate electrically and mechanically connecting said semiconductor substrate to said ceramic substrate, and leads connecting said diffused region to said bump electrodes;
   a control circuit disposed on said ceramic substrate for controlling said magnetic resistor element; and
   wire conductors disposed on said ceramic substrate electrically connecting said magnetic resistor element to said control circuit.

3. A hybrid integrated magnetic resistor device comprising:
   a ceramic substrate;
   a flip chip magnetic element including a glass substrate, bump electrodes mechanically and electrically connecting said glass substrate to said ceramic substrate, and a ferromagnetic film disposed on said glass substrate and electrically connected to said bump electrodes;
   a control circuit disposed on said ceramic substrate for controlling said magnetic resistor element; and
   wire conductors disposed on said ceramic substrate electrically connecting said ferromagnetic film to said control circuit.

* * * * *